United States Patent [19]

Fjelstad et al.

[11] Patent Number: 5,250,758
[45] Date of Patent: Oct. 5, 1993

[54] METHODS AND SYSTEMS OF PREPARING EXTENDED LENGTH FLEXIBLE HARNESSES

[75] Inventors: Joseph C. Fjelstad, Cupertino; Leo G. Svendsen, Redwood City; Gary I. Geschwind, Palo Alto; Raymond J. Noel, Jr., Menlo Park, all of Calif.

[73] Assignee: ELF Technologies, Inc., Foster City, Calif.

[21] Appl. No.: 703,724

[22] Filed: May 21, 1991

[51] Int. Cl.$^5$ ............................................. H01K 1/00
[52] U.S. Cl. ................................... 174/254; 174/72 A; 174/256; 174/262; 361/749; 428/901
[58] Field of Search ............... 174/72 A, 254, 255, 174/261, 262, 256; 156/13, 233, 345, 902, 901, 630; 29/624, 625, 626, 839, 846; 428/901; 361/398, 403, 408; 427/98, 97, 96

[56] References Cited

U.S. PATENT DOCUMENTS

| | | | |
|---|---|---|---|
| 2,600,343 | 6/1952 | Tuttle | 29/846 X |
| 3,009,010 | 11/1961 | Stearns et al. | 174/72 |
| 3,080,270 | 3/1963 | Lorenz | 156/233 |
| 3,383,564 | 5/1968 | Lalmond et al. | 174/254 |
| 3,497,410 | 2/1970 | Zagusta et al. | 156/233 |
| 3,535,780 | 10/1970 | Berger | 29/626 |
| 3,547,724 | 12/1970 | Zagusta | |
| 3,567,914 | 3/1971 | Neese | 174/261 |
| 3,601,590 | 8/1971 | Norton | 340/172.5 |
| 3,606,679 | 9/1971 | Schroeder | 29/626 |
| 3,712,735 | 1/1973 | Crumley et al. | 156/13 X |
| 3,723,635 | 3/1973 | Smith | 174/254 |
| 3,778,899 | 12/1973 | Johnson | 29/846 X |
| 3,808,505 | 4/1974 | Reimer | 174/254 X |
| 3,819,989 | 6/1974 | Branue | 29/624 X |
| 3,898,371 | 8/1975 | Bridgett | 174/72 A |
| 3,914,531 | 10/1975 | Zell et al. | 174/36 |
| 4,000,558 | 1/1977 | Cahill | 29/625 |
| 4,026,011 | 5/1977 | Walton | 361/398 X |
| 4,063,993 | 12/1977 | Burns | 29/624 X |
| 4,121,044 | 10/1978 | Hadersbeck et al. | 361/398 |
| 4,127,436 | 11/1978 | Friel | 156/902 X |
| 4,138,924 | 2/1979 | Seebach | 29/625 X |
| 4,177,519 | 12/1979 | Kasubuchi et al. | |
| 4,215,387 | 7/1980 | Negishi et al. | 361/398 X |
| 4,259,436 | 3/1981 | Tabuchi et al. | 156/630 X |
| 4,290,179 | 9/1981 | Bakermans et al. | 29/33 |
| 4,302,268 | 11/1981 | Tachiki et al. | 156/902 X |

(List continued on next page.)

OTHER PUBLICATIONS

"Flexible Printed Wiring and Connector Systems", McGraw-Hill; 1972 *Handbook of Wiring, Cabling and Interconnecting for Electronics* by B. A. Gerpheide.
"Non-Impact Printing Technologies," Sturge J. M. et al., 8th edition Imaging Processes and Materials, 1989, p. 377.
"Non-Impact Printing Technologies", Sturge J. M. et al., 8th edition Imaging Processes and Materials, 1989, p. 578.
"New Technology Allowed Through-Hole and SMT MultiLayer Quick Turn Prototype PCBs", B. Schillhamer, *PCNetwork*, Dec. 1990.

*Primary Examiner*—Leo P. Picard
*Assistant Examiner*—Trinidad Korka
*Attorney, Agent, or Firm*—Burns, Doane, Swecker & Mathis

[57] ABSTRACT

The invention relates to systems and methods for the manufacture of flexible printed wiring (FPW) harnesses of unlimited length three dimensions. In preferred embodiments, in-line raster scanning (e.g., xerography or laser printing) is used to image continuously updated conductor patterns on an uninterrupted (i.e., seamless) web-fed base material, or substrate With in-line manufacturing, an FPW harness equivalent to a discrete RWH of unlimited dimension can be fabricated. For example, the substrate can be cut to form circuit layout branches which are subsequently folded to produce three-dimensional shapes of unlimited size

28 Claims, 4 Drawing Sheets

U.S. PATENT DOCUMENTS

| | | | |
|---|---|---|---|
| 4,316,320 | 2/1982 | Nogawa et al. | 29/839 |
| 4,325,780 | 4/1982 | Schulz, Sr. | 156/902 X |
| 4,338,149 | 7/1982 | Quaschner | 29/830 X |
| 4,360,962 | 11/1982 | Suzuki et al. | 29/566 X |
| 4,384,755 | 5/1983 | Perretta | 361/410 X |
| 4,411,982 | 10/1983 | Shibuya et al. | 29/846 X |
| 4,424,627 | 1/1984 | Tarbox | 29/857 |
| 4,433,479 | 2/1984 | Suzuki et al. | 29/825 |
| 4,435,614 | 3/1984 | McAusland | 361/398 X |
| 4,465,538 | 8/1984 | Schmoock | 428/901 X |
| 4,477,484 | 10/1984 | Paoletti et al. | |
| 4,480,288 | 10/1984 | Gazdik et al. | 361/398 |
| 4,496,607 | 1/1985 | Mathias | |
| 4,551,914 | 11/1985 | Stiggelbout | 29/837 |
| 4,562,119 | 12/1985 | Darms et al. | 428/901 X |
| 4,587,719 | 5/1986 | Barth | 361/398 X |
| 4,588,468 | 5/1986 | McGinty et al. | 156/901 |
| 4,593,963 | 6/1986 | Endo et al. | |
| 4,600,996 | 7/1986 | Kawauchi | 250/492.2 |
| 4,626,462 | 12/1986 | Kober et al. | 428/901 X |
| 4,648,673 | 3/1987 | Endo et al. | |
| 4,649,497 | 3/1987 | Carlson et al. | |
| 4,670,351 | 6/1987 | Keane et al. | 361/398 X |
| 4,675,786 | 6/1987 | Mizuko et al. | 361/398 |
| 4,680,675 | 7/1987 | Sato | 361/398 X |
| 4,681,421 | 7/1987 | Yamada et al. | 354/485 |
| 4,682,415 | 7/1987 | Adell | 29/846 |
| 4,687,695 | 8/1987 | Hamby | 428/901 |
| 4,715,928 | 12/1987 | Hamby | 428/901 X |
| 4,716,259 | 12/1987 | Tokura et al. | 361/398 X |
| 4,767,489 | 8/1988 | Lindner | 156/345 |
| 4,779,340 | 10/1988 | Kihm et al. | 361/398 X |
| 4,781,969 | 11/1988 | Kobayashi et al. | 428/901 X |
| 4,815,984 | 3/1989 | Sugiyama et al. | 174/72 A X |
| 4,829,404 | 5/1989 | Jensen | 361/398 |
| 4,831,278 | 5/1989 | Ueda et al. | 174/72 A X |
| 4,831,279 | 5/1989 | Ingraham | 307/116 |
| 4,853,252 | 8/1989 | Frankel et al. | 427/98 X |
| 4,876,177 | 10/1989 | Akahoshi et al. | 427/98 X |
| 4,885,430 | 12/1989 | Kinser, Jr. et al. | 174/254 |
| 4,895,735 | 1/1990 | Cook | 427/96 X |
| 4,906,803 | 3/1990 | Albrechta et al. | 174/254 |
| 4,958,050 | 9/1990 | Oku et al. | 174/261 |
| 4,980,802 | 12/1990 | Champagne et al. | 361/401 |
| 5,082,253 | 1/1992 | Suzuki et al. | 269/902 X |

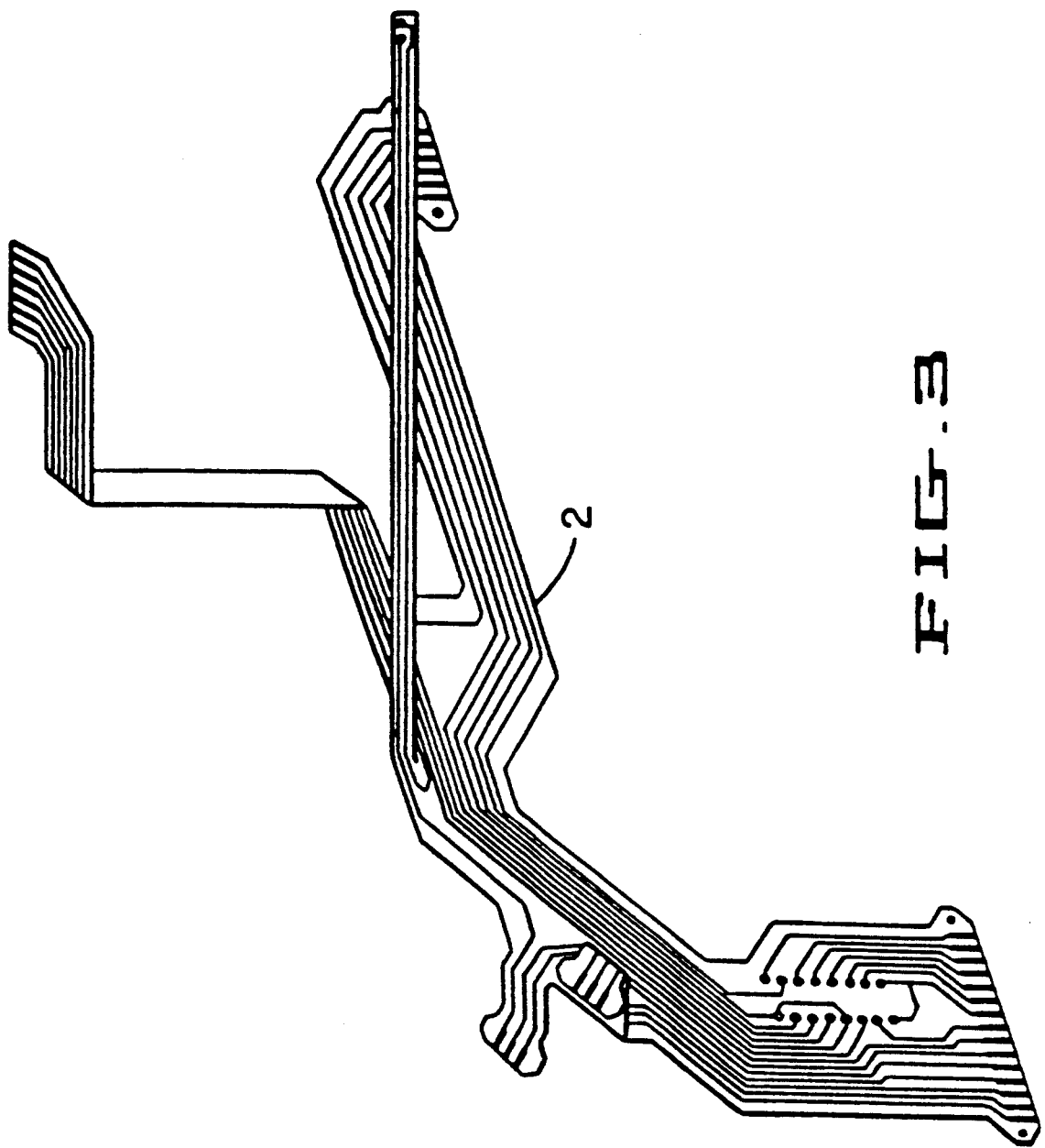

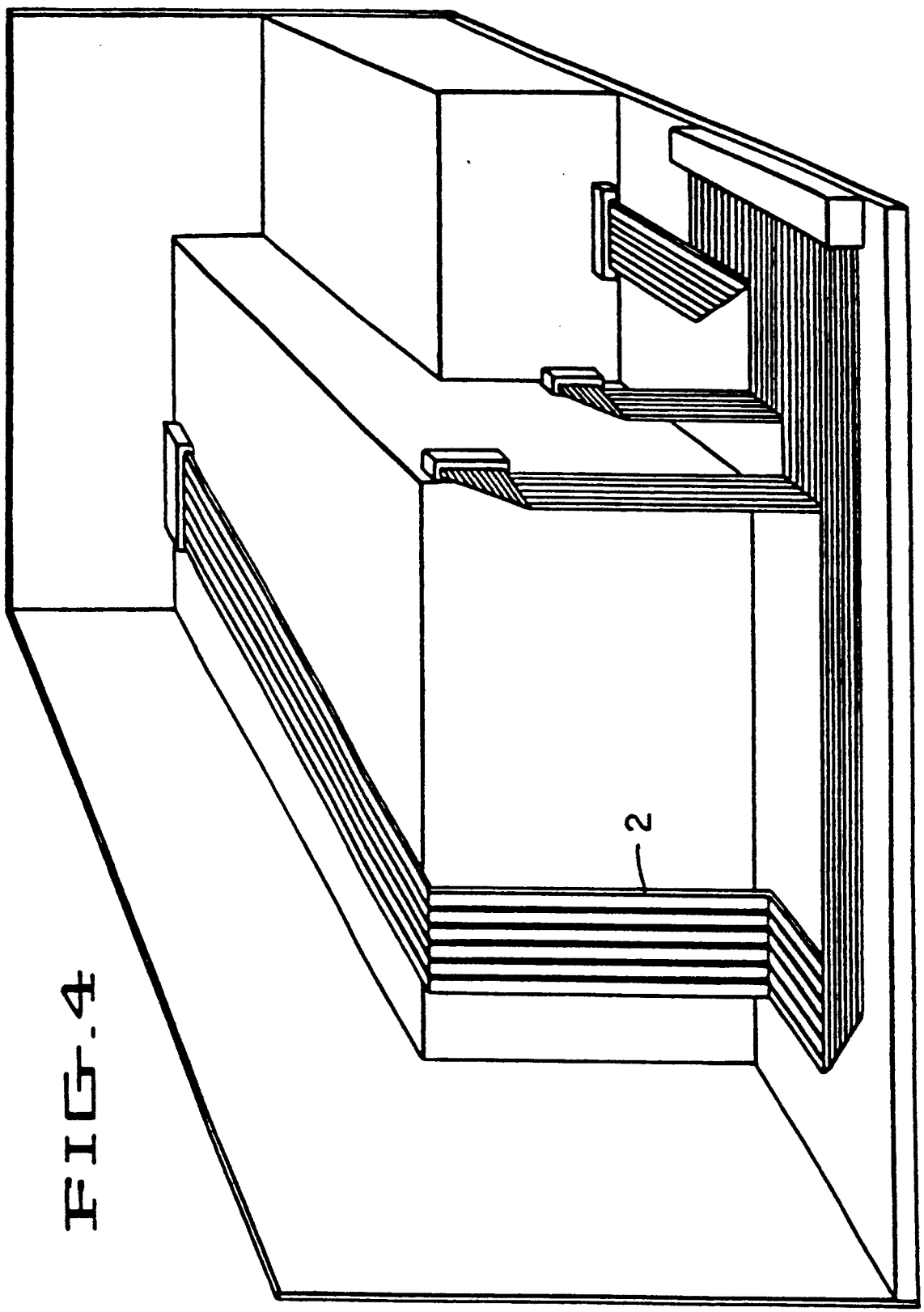

METHODS AND SYSTEMS OF PREPARING EXTENDED LENGTH FLEXIBLE HARNESSES

BACKGROUND OF THE INVENTION

1. Field of the Invention

The present invention relates generally to systems and methods for designing and fabricating conductive wiring harnesses. More particularly, the invention relates to methods for fabricating wiring harnesses as uninterrupted (i.e., seamless) flexible printed circuitry of unlimited dimension on a continuous, web-fed substrate.

2. State of the Art

Presently, round wire harnesses (RWHs) are used in large scale systems (e.g., large appliances, automobiles, office wiring, industrial control panels, and commercial and military aircraft) to interconnect circuit components. An RWH typically includes a bundle of individual wire conductors terminated in connectors for attachment to the various circuit components.

While an RWH provides large scale interconnection of components, it suffers from significant drawbacks. For example, because RWH is used in large scale systems, the number of conductive paths is relatively large. The complex routing and connection of the various conductive paths therefore make it difficult to handle the RWH and render assembly of a system using RWH labor intensive. Use of an RWH also results in a highly disorganized wiring scheme in which misconnections of conductors frequently occur and in which location of faults (e.g., breaks in conductive paths) cannot be readily identified and corrected.

RWH includes a large number of individual, round conductors which consume a significant volume of space and which add substantial weight to a system. Because individual wires are routed, an RWH is also highly susceptible to cross-talk and to impedance mismatches with system components.

Further, because an RWH is a bundle of individual wire conductors, the strength of the overall system is limited to the strength of each individual conductor. Therefore, if a single wire is structurally stressed (i.e., typically the shortest conductor), that conductor can break. As mentioned previously, subsequent identification and correction of such breaks are difficult due to the routing complexity of an RWH. Further, this structural limitation often leads to a harness configuration being dictated by strength requirements rather than electrical requirements, such that the harness is often heavier than necessary.

Another significant drawback of an RWH is its inability to accommodate modifications in the conductive path layout. Rather, circuit component changes and/or routing modifications of the conductive paths are typically achieved by the addition of new conductive wiring paths, adding to the complexity of the overall system or by a complete redesign of the system, increasing the time required to produce a finished harness.

In small scale applications, efforts have been made to address the foregoing drawbacks with the introduction of flexible printed wiring, or FPW. For example, in the book entitled *Handbook of Wiring, Cabling and Interconnecting for Electronics*. 1972: McGraw-Hill, Chapter 9 relates to "Flexible Printed Wiring and Connector Systems". Flexible printed circuits are described therein which employ thin, flexible insulation to support circuitry which is covered with a thin overlay of insulation.

In a process schematic shown in Chapter 9, FIG. 10 of the aforementioned book, an FPW circuit layout is designed by first creating a circuit layout master. Using the circuit layout master, a layout of conductors is imaged on a photographic negative from which a camera positive is produced. A screen is then fabricated from the camera positive for applying resist to the copper surface of a base material (i.e., substrate).

Afterwards, chemical etching is used to remove copper left unprotected by the resist. The remaining copper constitutes a desired pattern of conductive paths on the substrate. After the remaining resist is chemically removed, an insulating overlay is subsequently laminated to the surface, the overlay being of the same material as the base.

In an alternate process described in Chapter 9 of the aforementioned book, the camera negative is used to form the layout of conductive paths. In this process, a photoresist is applied to the entire copper surface. Afterwards, ultraviolet light is passed through the camera negative to "fix" the photoresist material to the base in those areas where conductive paths are to be formed. Unprotected areas of the copper layer are then chemically etched, followed by lamination with an insulating overlay, as described above.

Despite the significant advantages FPW circuits have realized in small scale applications (e.g., cameras, telephones, personal computers, disk drives, and automobile dashboards), present technology does not provide for the creation of large-scale FPW systems which can replace RWH. For example, screen printing and photography techniques similar to those described above are currently used to produce flexible printed circuits in a batch fashion. Units, or panels, of limited size (e.g., two feet square) are typically processed one at a time because this is roughly the largest size the image-producing step (e.g., screen printing or photography) can handle easily. Further, current image-production is fairly expensive or slow to alter, resulting in high overhead costs and delays for the small number of runs which would be associated with large-scale FPW.

Because the size limitations associated with FPW have been recognized and accepted by industry, technology in this area has focused on maximizing the use of the available space on a size limited substrate. For example, U.S. Pat. No. 4,587,719 discloses a method of batch fabricating flexible circuits in an effort to provide area efficient use of a size limited substrate. As disclosed therein, orthoganol lines of conductors are joined and folded about axes parallel to the conductors. Although the disclosed method permits flexible arrays to be fabricated, its use of traditional imaging techniques imposes size constraints on the overall circuit layout design which prohibit its use as an RWH.

Further, U.S. Pat. No. 3,819,989 relates to a printed wiring multiple circuit board assembly wherein printed circuit boards are arranged at right angles to a flexible main tape 10. The flexible main tape is formed with a plurality of conductors and tape tabs 12 through 15 using conventional techniques. The tape tabs connect the main tape 10 and a plurality of overlays 16 through 19. The overlays are formed on each side of the main tape and are bonded to conventional rectangular circuit boards situated in mutually parallel planes perpendicular to the main tape. However, like U.S. Pat. No. 4,587,719, the system of U.S. Pat. No. 3,819,989 fails to disclose fabrication techniques which would permit the manufacture of RWH replacements.

Techniques aimed at joining sectors of FPW to produce the equivalent of an RWH (i.e., a "step and repeat" process) have also been attempted. However, these techniques increase manufacturing complexity and cost, and do not provide a cost effective three-dimensional breakout routing (i.e., branching) capability necessary for RWH replacement. Although individual and unique FPW segments could be combined to produce breakouts suitable for three-dimensional routing, such a combination would significantly increase the number of interconnections, further increasing design and manufacturing complexity and decreasing system reliability.

To address some of the drawbacks associated with the aforementioned step and repeat processes, U.S. Pat. No. 3,712,735 discloses a photoresist pattern controlled continuous strip etching apparatus. Here, a continuous loop photographic film transparency of a master pattern is used for contact photo printing of the pattern onto a moving resist coated strip. Because this apparatus merely addresses the problems associated with step and repeat processes by increasing the size of the master film transparency, many of the aforementioned drawbacks associated with small scale FPW applications are incurred. For example, circuits produced by the disclosed apparatus are limited to the size of the master film transparency and are not readily adapted to in-line modifications of the conductor patterns once the master film transparency has been produced.

Thus, while FPW has many recognized advantages relative to RWH, the size limits of FPW have rendered its use in replacing RWH impractical.

SUMMARY OF THE INVENTION

Accordingly, a purpose of the present invention is to provide systems and methods for fabricating electrical harnesses capable of replacing RWH. To adequately replace RWH, the harness should provide three-dimensional breakout routing capability and be free of size restrictions. Further, a purpose of the invention is to provide systems and methods for fabricating harnesses such that the circuit layout can be readily modified electronically with limited manipulation of the fabrication process. Such design modifications include, for example, adaptation of a given circuit layout to systems of varied shapes and dimensions. In addition, a purpose of the invention is to provide high throughput of a harness from design to manufacture, and to eliminate high cost inventory requirements associated with the manufacture of traditional RWH.

To achieve these purposes, the invention relates to systems and methods for the manufacture of three dimensional FPW harnesses of unlimited size. In preferred embodiments, an in-line raster scanning (e.g., xerography or laser printing) is used to image conductor patterns on a continuous, web-fed base material, or substrate. As the substrate is fed, the raster scanned image is continuously refreshed.

With in-line manufacturing, an uninterrupted (i.e, seamless) FPW harness equivalent to a discrete RWH of unlimited size in three dimensions can be fabricated. For example, the substrate can be cut to form circuit layout branches which are subsequently folded to produce three-dimensional shapes of unlimited size.

The present invention thus overcomes the significant drawbacks associated with traditional RWH. For example, a harness fabricated in accordance with the present invention represents an organized layout of conductive paths having relatively small volume and weight requirements and enabling excellent control of cross-talk and impedance mismatches.

Further, the present invention affords significant advantages not previously realized in fabricating harnesses of any size. For example, the in-line raster scanning of a conductor pattern onto a continuously fed substrate provides high throughput while affording optimum design flexibility. An original FPW design and/or subsequent design modifications can be remotely communicated via, for example, telephone networks.

Virtual inventory or electronic inventory can also be exploited in preferred embodiments to avoid any need to maintain a supply of round wire conductors having different sizes and color codes. Only generic raw materials need be maintained in inventory. Because various conductive paths of the layout can be labelled during fabrication, any need to label round wires (traditionally done by direct printing on the wire jacket, color coding or the addition of label sleeves) can be eliminated.

Yet another advantage of the present invention is that the fabrication of a harness as a single FPW element relieves the strain placed on the individual conductors of an RWH. Further, the ability to contour FPW to irregularly shaped surfaces in accordance with the present invention permits increased heat sinking.

In accordance with a preferred embodiment, an extended length flexible printed electrical harness is created by continuously feeding a substrate to an imaging means. In the imaging means, an image of a continuously updated conductor pattern is created electronically on a computer or in hard copy such that the image can be transferred to the substrate. The substrate is raster scanned either directly or indirectly to image the conductor pattern thereon. Conductive paths are established on the substrate in accordance with the pattern and are covered with a protective insulating film. The flexible substrate is then cut to form circuit layout breakouts, or branches, and the branches are folded to produce three-dimensional shapes of unlimited size.

BRIEF DESCRIPTION OF THE DRAWINGS

Other objects and advantages of the present invention will become more apparent from the following detailed description of preferred embodiments when read in conjunction with the accompanying drawings, wherein like elements have been designated with like numerals, and wherein;

FIG. 3 shows a more detailed illustration of an exemplary FPW harness formed, cut and folded in accordance with a preferred embodiment; and FIG. 4 shows an exemplary FPW harness formed, cut, folded and placed for a given end use.

DETAILED DESCRIPTION OF THE PREFERRED EMBODIMENTS

Figure 1:
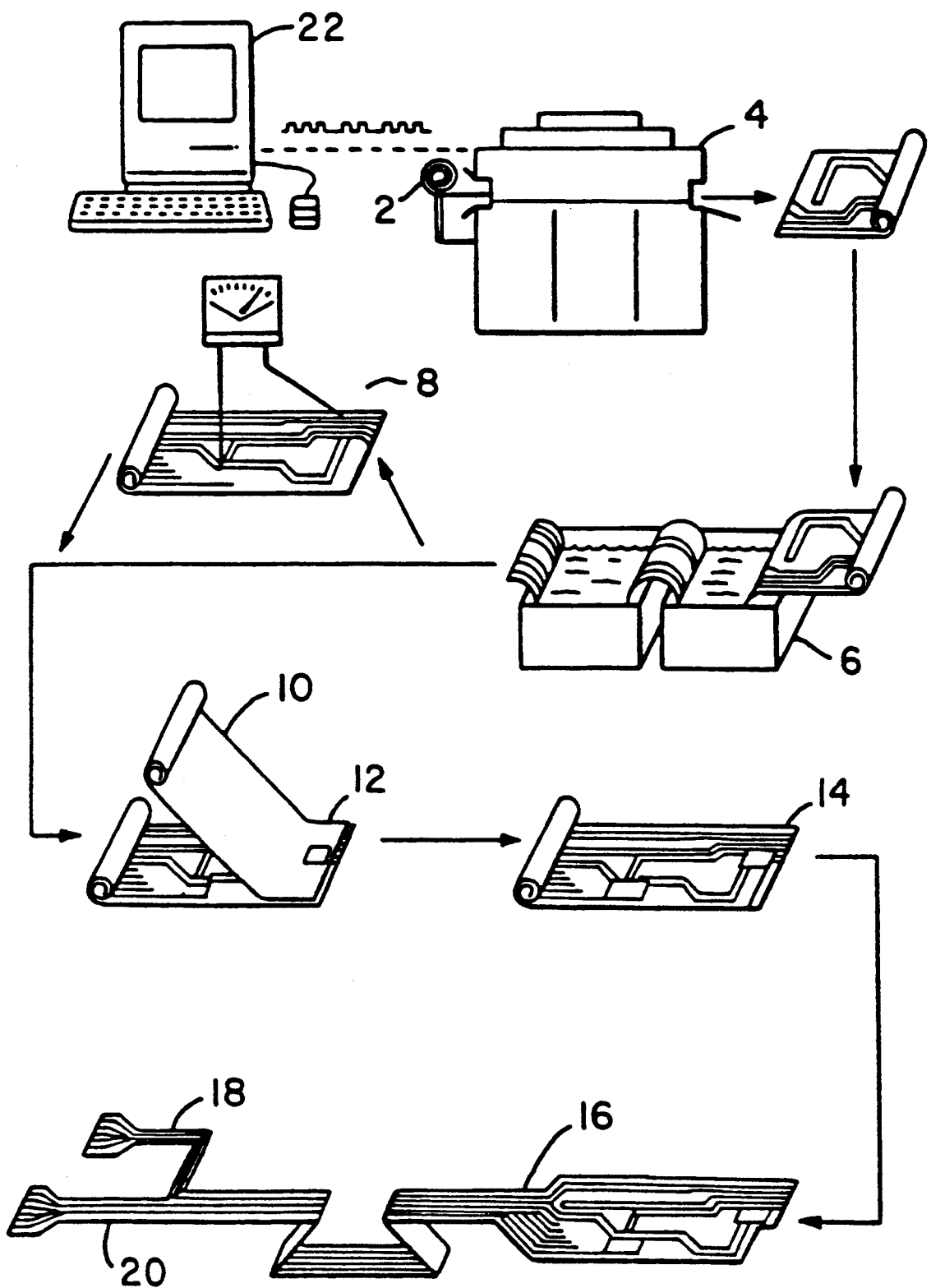
FIG. 1 shows an exemplary system for fabricating an FPW harness in accordance with a preferred embodiment.

In a preferred embodiment, an extended length FPW harness of conductive paths is fabricated by continuously moving, or web-feeding, an uninterrupted (i.e., seamless) flexible substrate through four general fabrication stations. The first of these includes an imaging means wherein an image of a continuously updated conductor pattern is created electronically on a computer or in hard copy such that the image can be transferred to the substrate. The substrate is raster scanned either directly or indirectly to image the conductor pattern on the substrate as it is fed. In a second general stage of fabrication, conductive paths are established on the substrate in accordance with the pattern. The conductive paths are subsequently covered with a protective insulating film in a third general stage. The flexible substrate passes to a fourth general stage wherein it is cut to form circuit layout breakouts, or branches. The branches can then be folded to produce three-dimensional shapes.

Each of these stages will now be described in greater detail. It will be appreciated by those skilled in the art that while each of these stages is described separately, any or all of these stages can be combined into a single stage wherein each of the foregoing steps can be performed in sequence. Further, it will be appreciated that appropriate buffering between stages is necessary to accommodate different processing speeds within each stage.

1. Image Conductor Pattern on Substrate

In accordance with preferred embodiments, four general techniques can be used for creating conductive paths on the web-fed substrate: an additive process of forming conductive paths; a subtractive process of forming conductive paths; a conductive ink process; and a tack and peel process. The technique selected for creating the conductive paths will dictate the technique or techniques which can be used to image the conductor pattern, either directly or indirectly, on the substrate. Accordingly, a brief discussion of the four general techniques for creating conductive paths will be provided before discussing the various imaging techniques.

With each of the four general techniques, raster scanning is used to image a conductor pattern corresponding to the paths of an RWH. Further, patterns can be raster scanned on the substrate for in-line testing and inspection of circuits. Raster scanning can be effected in a manner similar to that described in the book *Imaging Processes and Materials*. Sturge, J. M. et al., 8th ed., 1989, the disclosure of which is hereby incorporated by reference in its entirety. For example, Chapter 13 of the aforementioned book is entitled "Non-Impact Printing Technologies" by Werner E. Haas and describes raster scanning with a scanning e-beam tool on page 377. Further, Chapter 18 of the aforementioned book is entitled "Imaging For Microfabrication", by J. M. Shaw and describes the use of deflectors for raster scanning on page 578.

As described on page 578 of the *Imaging Processes and Materials* book, raster scanning generally refers to mechanical and electrical scanning with, for example, an electron beam. The beam is switched on and off in accordance with pattern data to image the pattern on a desired surface.

In the first technique mentioned above (i.e., additive process), the substrate is raster scanned, either directly or indirectly, to selectively image a conductor pattern (e.g., transfer plateable toner) on those portions of the substrate where conductive paths are to be formed. Once imaged, the patterns are built up (e.g., plated) additively with a conductive material to form the conductive paths.

The second general technique mentioned was a subtractive process, wherein the substrate is coated in its entirety with a conductive material. Afterwards, the substrate is raster scanned, either directly or indirectly, to image for removal those portions of the substrate where the conductive material is to be removed (positive working resist) or, conversely, to image for retention those portions where the conductive material is to remain (negative working resist).

With the third general technique (i.e., plateable ink technology), an ink-jet printer scans the substrate and deposits a catalytic ink (e.g., containing a binder and catalyst such as Sn/Pd) onto selected portions of the substrate surface. As with the additive process described above, conductive paths can subsequently be formed on these portions of the substrate using a plating process. Alternately, the imaging of a conductor pattern and the establishment of conductive paths on the pattern can be combined into a single stage. More particularly, an ink-jet printer can be used to directly scan the substrate while depositing ink containing metal spheres or conductive polymers.

In the fourth general technique, a tacky surface pattern corresponding to a predetermined conductive path is created on the substrate by, for example, transferring electrophotographic or magnetographic toner from a drum, or by ink-jet or dot matrix printing of an adhesive onto the substrate. Alternately, the image of a conductor pattern can be scanned onto a surface coating of the substrate, and the substrate rendered tacky in locally softened imaged areas by light exposure or by chemical or thermal means. Regardless of the technique selected for creating a tacky surface, the surface is subsequently laminated with a metal film. The metal film is then removed (e.g., sucked or peeled) where no tack is available. If the film is very thin, an electrolytic plating step, as will be described below, may be necessary to build up the conductive paths.

As mentioned above, the substrate can be raster scanned either directly or indirectly. As referenced herein, direct raster scanning encompasses image creation of a conductor pattern directly on the substrate. On the contrary, indirect raster scanning encompasses image creation of a conductor pattern on a drum (e.g., photocopier drum) or photosensitive belt. The image is then transferred to the substrate from the drum or belt.

In both direct and indirect scanning, the image of the conductor pattern is continuously refreshed, or updated, as the substrate is fed. For example, while a conductor pattern is being imaged on the moving substrate, a subsequent conductor pattern stored in memory can be prepared for imaging a down line portion of the substrate.

Direct scanning can be effected using impact or non-impact write-heads, such as: a laser in a laser printer, a nozzle in an ink-jet printer, LEDs, electrophotography (i.e., electrophotographic plateable toner technology), magnetographic plateable toner technology, and ionography (i.e., ionographic plateable toner technology). The scanning of the substrate can be effected by deflecting light (e.g., laser light) off a mirror surface or by directing light, liquid or solid particles toward the surface through a pivoting head and a shutter. An electrically charged scanning stylus can also be used to electrically erode the substrate to implement a subtractive process. Alternately, the stylus can be any known stylus suitable for piercing, drilling, routing or cutting a surface of the substrate. Any of these direct transfer mechanisms can be situated in clusters or arrays to improve printing speed.

The aforementioned nozzles can also be known nozzles for transferring a catalytic ink to form a catalytic pattern on the substrate. As will be described, the pattern of catalytic ink is subsequently plated additively to build up conductive paths on the substrate. In a subtractive process of pattern creation, an ink acting as an etch resist can be transferred to the substrate for subsequent etching. In this latter case, resist can be selectively fixed on the substrate over those areas where conductive paths of the circuit layout are to be formed.

Indirect scanning can be effected by transferring a conductor pattern to be formed on the substrate onto a drum as in conventional photocopying (e.g., electrophotography) using liquid toners or dry toners. Subsequently the pattern on the drum is transferred to the substrate. The pattern on the drum is then continuously refreshed, or updated, as the substrate is fed.

FIG. 1 shows an exemplary in-line system for fabricating extended length FPW harnesses of unlimited dimension on a continuous, web-fed substrate using an additive process. In FIG. 1, a continuous polymer (e.g., polyimide) substrate 2 formed as a flat sheet is web-fed into an imaging means. In a preferred embodiment, the imaging means is a known laser printer 4, such as a Versatec 8836-II monochrome laser plotter. As an insulating substrate, thermoset films such as polyimide films coated with acrylic, epoxy or TFE adhesives, thermoplastic films such as polyester coated with polyester or epoxy adhesives, or polyetherimide (Ultem TM) films whose surface acts as an adhesive can be used upon which conductive (e.g., metal) paths can be formed.

In the FIG. 1 embodiment, a catalytic plateable toner, such as that described in U.S. Pat. No. 4,504,529, is raster scanned directly on the substrate for subsequent electroless plating. As will be further described below, the use of raster scanning to transfer the catalytic toner onto the continuously moving substrate 2 permits creation of a flexible printed harness having unlimited dimensions.

The laser printer 4 includes a computer work station 22 which provides in-line computer aided design (CAD) of the conductor pattern on the substrate. Using CAD, original circuit pattern designs and/or modifications can also be received on-line from remote sources (e.g., via telephone networks) and used to update the circuit pattern being imaged (e.g., add or delete patterns).

CAD can be implemented in a manner similar to that described for conventional printed circuit boards (PCBs) in the article "New Technology Allows Through-Hole and SMT Multilayer Quick Turn Prototype PCBs," PCNetwork, by Bill Schillhamer, December 1990, and U.S. Pat. No. 4,767,489, the disclosures of which are hereby incorporated by reference in their entirety. CAD systems such as the Mentor Graphics Cable Station TM can be used to design RWH in three dimensions and to print these harnesses by the techniques described herein on the substrate. Thus, circuit design modifications can be readily implemented during fabrication.

Further, irregular images of multiple different circuits can be printed on the same substrate. These irregular images can be nested in a CAD memory before actual printing. By organizing the irregular shapes on the substrate, space usage of the substrate can be optimized and material waste can be minimized upon forming the conductor patterns to a final shape.

If it is desirable to image conductor patterns on different sides of the substrate, vias through the substrate can be formed to permit interconnection of these patterns. More particularly, prior to imaging a conductor pattern on the substrate, the substrate is perforated to form the vias.

In a preferred embodiment, perforation of the substrate is performed by the imaging means. For example, hole punching, cutting, drilling or routing can be effected by:

Scanning laser ablation (e.g., $CO_2$ or Eximer);
High speed drills or routers;
Water-jet cutting;
Scanning abrasive-blaster.

Further, a modified impact or dot matrix printer can be used to directly punch through the substrate layer, or high temperature rods can be used to melt through the substrate. The nozzles described previously for scanning the substrate can also be used to effect the aforementioned step of perforating the substrate. The nozzles can dispense chemicals for etching the substrate to form the holes (i.e., perforate the substrate) and to carry out routing. Alternately, the nozzles can dispense eroding particles to perform the etching by boring and routing the substrate in a manner akin to sand-blasting. In addition, the nozzles can direct water toward the substrate for water-jet cutting.

While FIG. 1 depicts an exemplary preferred embodiment, it will be appreciated that other imaging techniques, some of which have been mentioned above, can be used. For example, a totally catalytic substrate surface can be formed either by coating the surface with the catalyst or by incorporation of the catalyst into the substrate material. Afterward, a plating resist can be selectively scanned onto the surface with an imaging means such as a photocopier, a laser printer, an LED-/ionographic device, or an ink-jet printer. The resist coated portions of the substrate are thus prevented from subsequent plating with conductive materials. For example, "ink"-tape on a normal dot matrix printer can be either a catalyst (for electroless plating) or a resist, depending on whether a non-catalytic or a catalytic substrate is used.

In yet another additive process embodiment, the substrate is coated with a thin metal laminate, and a resist is transferred thereto (e.g., impact or non-impact printing) during the imaging stage. The resist is then removed from selected portions of the substrate to image a conductor pattern on the substrate which is subsequently plated to form the conductive paths. Afterwards, removal of the resist and chemical removal of the remaining thin areas which were covered by the resist can be effected.

In alternate additive process embodiments, different toners (e.g., electrophotographic and magnetographic toners) or the catalytic ink in an ink-jet printer can be transferred to form a resist pattern on a metal drum. The drum is then additively or electrolytically plated in areas where no resist is present. Afterward, the conductive paths are peeled off the drum by using a substrate which has been coated with a tacky surface.

As mentioned previously, subtractive techniques can also be used. Subtractive techniques start out with a substrate clad produced by lamination of the polymer substrate with metal films. The polymer film may have the metal (e.g., copper) laminated to one or two sides An exemplary subtractive method selectively deposits etch resist over areas that are to remain as circuitry. These areas correspond to the conductor patterns which become conductive paths by, for example, chemically etching away the metal left unprotected in the image-producing step.

An ink-jet printer or dot matrix printer can also be modified to raster scan a substrate and to selectively deposit the etch resist as an ink directly on the substrate. Alternately, toner can be used as a screen on top of a normal etch resist film to effect a subtractive technique for creating an FPW harness. Subsequent development of an image representing a conductor pattern of the FPW harness can then be used to produce an etch pattern made from common resist films.

Where a resist layer has been non-selectively deposited over a conductive layer, a high powered laser can be used to remove the etch resist film down to the conductive layer. This exposes those portions of the conductive layer which are to be removed. Plasma etching techniques can also be used to remove the resist film. Alternately, to selectively identify those areas where the metal is to be removed, a master can be continuously formed on a transparent surface by, for example, laser printing or ink-jet printing. This master is then synchronously fed into an exposure unit to transfer the conductor pattern image from the transparent film to the photographic etch resist on the metal substrate.

To implement subtractive techniques, electrophotographic or magnetographic toner can also be used as an etch resist. Further, solder can be substituted as an etch-resist. More particularly, using techniques similar to those described above for ink-jet printers, molten solder can be directly raster scanned as solder resist onto the substrate.

In a related embodiment, information such as bar codes legends, datums and fiducials can be created by any ink-jet printer, laser printer or impact/dot matrix printer that will print on a web. This information facilitates implementation of statistical process control. For example, this information can be printed on the substrate by using the imaging means to label various conductive paths. Such labelling greatly simplifies identification of conductive paths so that accurate connection of the FIG. 3 FPW harness to the end system (e.g., see FIG. 4) can be attained.

2. Form Conductive Paths on Substrate

In the exemplary FIG. 1 embodiment, after the conductor pattern has been imaged on the substrate, the substrate exiting the laser printer 4 is directed to a continuous roll plating stage 6. In the plating stage, the substrate is continuously transported through plating solutions such that conductive material (e.g., copper) plates the catalytic toner formed during the laser printing stage. The plating takes place catalytically only on the surfaces where an initial catalyst was located (e.g., electroless plating). If necessary, the metal traces which form the conductive paths can be thickened by electroplating over the electroless deposit.

As mentioned previously, exemplary embodiments can be implemented using both additive and subtractive formation of conductive circuitry on a substrate. For example, with additive processes, an FPW harness can be formed using a surface that is rendered catalytic for additive plating processes, as discussed above.

For additive processes, conductive paths can be formed on the substrate using the aforementioned known techniques, including ionographic plateable toner technology (PTT), electrophotographic plateable toner technology and magnetographic plateable toner technology. However, as described previously, it will be appreciated that the invention is not limited to the use of a catalyst which is subsequently plated. For example, if adhesive toners are used to implement the imaging of a conductor pattern either directly or indirectly, subsequent "tacking off" of metal from a sacrificial sheet is used to transfer a metal pattern for forming the conductive paths. Alternately, if the substrate is melted to image the conductor pattern, metal or catalytic particles are "tacked down" to create the conductive path.

As mentioned previously, conductive paths can also be implemented using known conductive inks. These conductive inks can be put down directly from a modified ink-jet printer thus combining the imaging and formation of conductive paths into a single stage.

For subtractive processes, conductive paths can be formed by chemically etching a substrate formed with a conductive layer, as previously discussed. Once portions of the metal substrate have been exposed, an etching step is initiated to etch away the exposed metal film. Thus, only the metal film covered by the resist remains on the substrate to form the conductive paths of the FPW harness. Continuous etching can, for example, be implemented following the transfer of resist to a metal laminate using either impact or non-impact techniques, as described previously.

3. Cover Conductive Paths with Insulating Layer

In the exemplary FIG. 1 embodiment, the substrate is fed from the plating bath 6 through a quality control station 8 (e.g., inspection station) to a lamination station 10 which includes, for example, a hot roll laminator available from General Binding Corp. In the lamination station, an insulating protective cover 12 is formed with vias corresponding to contact points of the conductive paths. The laminate is then pressed onto the substrate as both the laminate and the substrate are unrolled.

A preferred embodiment for a single layer circuit is a protective layer on top of the conductive paths, which can be created by laminating a pre-routed insulative layer (i.e., corresponding to the conductor pattern) onto the substrate layer. Prior to the lamination, openings for component contacts or for path interconnections are provided in the insulative layer by routing/drilling processes similar to those described above for perforating the substrate.

In an alternate embodiment, a lamination film is cured in a pattern on the substrate by scanning a UV-laser on an uncured surface coating. The areas which are not cured by the laser light are subsequently developed away using a known, suitable developer solution to form vias in the lamination.

Electrophotographic or magnetophotographic toner can also be used to create the insulating layer. More particularly, the toner is printed in the desired pattern on the finished conductor layer and then brought to coalesce and cross-link on top of the circuit pattern to create a continuous protective surface with the necessary openings.

In another embodiment, several conductive layers can be formed on the substrate. For example, combining plating additive processes with the formation of a protective layer over each layer of conductive paths makes it possible to build up a multi-layer FPW harness in endless lengths. If several layers have to be laminated, a protective coating can be applied by: raster imaging of insulative toners, screen printing, roller coating with an adhesive or use of a conventional insulative layer after deposition of each conductive layer. The relative position of the layers can be maintained by tacking them down using adhesive dispensed in a manner described previously with respect to creating a tacky surface. Interconnection openings, or pads, between the layers can be formed through the multilayer structure using techniques as described above or by covering areas of the screen where interconnects are desired.

Solder can be reflowed on interconnection pads by applying it through a high temperature ink-jet printer. The molten solder flows into the interconnect holes of the multilayer circuit to electrically connect one or more conductive layers.

4. Slit and Fold of FPW Harness

Figure 2:
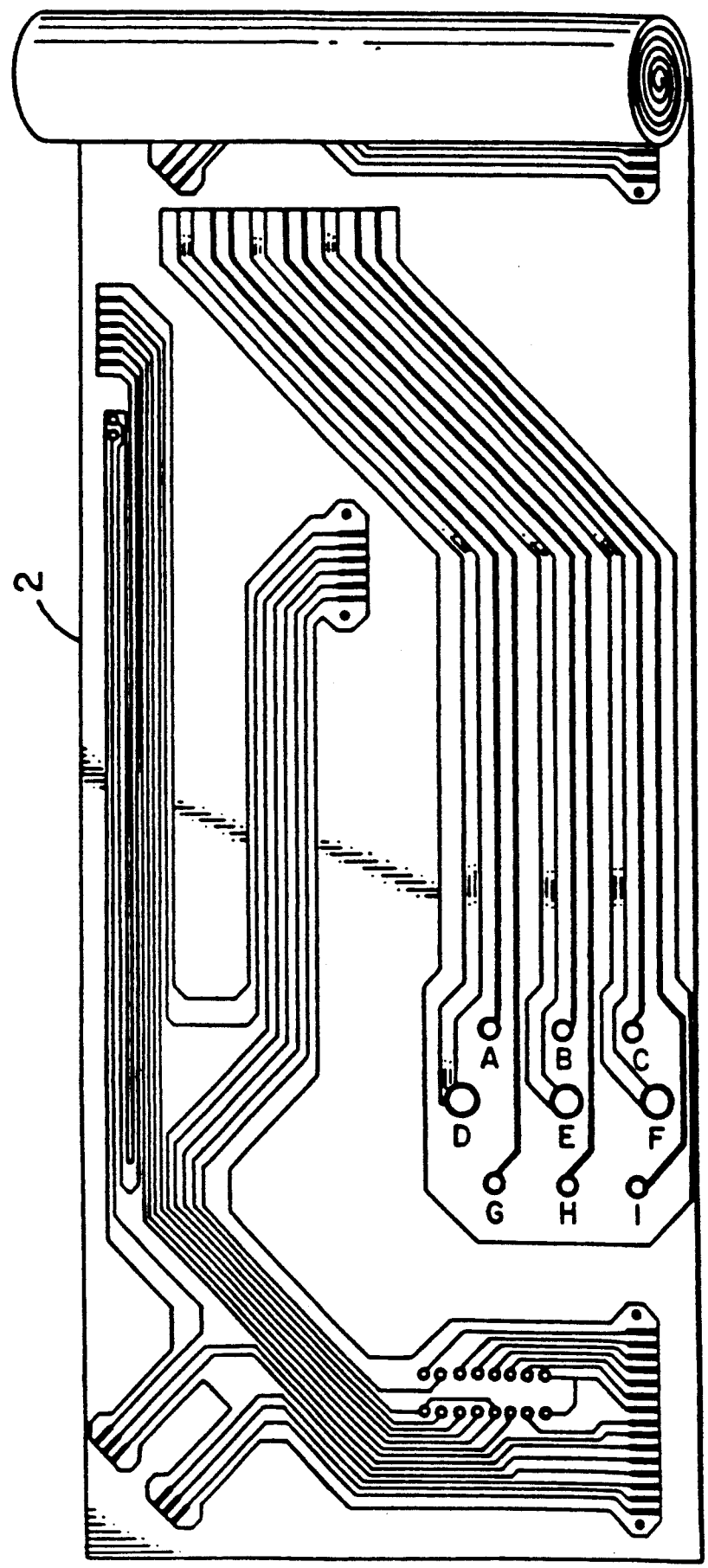
FIG. 2 shows an exemplary, uncut FPW harness formed in accordance with a preferred embodiment.

After the FPW harness has been formed with the conductive paths it can be cut, or slit, to permit folding to its final shape using techniques as described previously (e.g., water jet cutting, laser ablation, and so forth). FIG. 2 shows an extended length flexible conductor harness formed in accordance with a preferred embodiment of the present invention. As shown in FIG. 2, the harness includes a plurality of conductive paths formed on a common flexible substrate. Folds for final assembly can be put into the FPW harness, as shown in FIGS. 3 and 4.

The FPW harness shown in FIG. 2 can be cut or slit and then folded and/or rolled for shipment. Afterwards, the harness can be unrolled and (if not folded during manufacturing) folded in predetermined directions, as shown in FIG. 3. Because the harness can be of unlimited dimension in the raster scanned direction with which it was formed (e.g., from the left to the right of the harness in FIG. 2), subsequent slitting and folding of the harness permits unlimited fabrication of the harness in three dimensions. FIGS. 3 and 4 show that creating the FPW harness by raster scanning, slitting and folding permits creation of a printed circuit harness having unlimited dimensions.

To effect the slitting operation in the exemplary FIG. 1 system, the laminated substrate 14 is transferred to a cutting station 16. Here, cuts are made in the substrate, as described above, to form harness branches. These branches, such as branches 18 and 20 in the FIG. 1 harness, can subsequently be folded to form a three-dimensional harness. In an alternate embodiment, the cuts can be made during formation of the conductive paths, in which case the laminate is formed over only those portions of the substrate which constitute the final FPW harness assembly.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. An extended length printed harness formed on a flexible substrate, said harness comprising:
   a toner image of a continuously updated conductor pattern formed on a continuous flexible substrate; and
   a conductive path established as a harness branch on the continuous flexible substrate in accordance with the toner image of the conductor pattern.

2. An extended length printed harness formed on a flexible substrate, said harness comprising:
   a toner image of a continuously updated conductor pattern formed on a continuous flexible substrate; and
   a conductive path established as a harness branch on the continuous flexible substrate in accordance with the toner image of the conductor pattern.

3. An extended length printed harness according to claim 1, further comprising:
   perforations formed in the substrate by mechanical means.

4. An extended length printed harness according to claim 1, further comprising:
   perforations formed in the substrate by laser ablation.

5. An extended length printed harness according to claim 1, further comprising:
   perforations formed in the substrate by abrasive blaster means.

6. An extended length printed harness according to claim 1, wherein the substrate is directly scanned to form said conductor pattern.

7. An extended length printed harness according to claim 6, wherein said conductor pattern is continuously updated as the substrate is being scanned.

8. An extended length printed harness according to claim 6, wherein said direct scanning is performed by directing laser light toward the substrate.

9. An extended length printed harness according to claim 6, wherein said direct scanning is performed by directing liquid particles toward said substrate.

10. An extended length printed harness according to claim 6, wherein said direct scanning is performed by directing solid particles toward said substrate.

11. An extended length printed harness according to claim 1, wherein said substrate is indirectly scanned to form said conductor pattern.

12. An extended length printed harness according to claim 11,
   further including:
   a conductor pattern transferred from a drum or belt to the substrate.

13. An extended length printed harness according to claim 12, wherein said conductor pattern is continuously updated on said drum or belt as said conductor pattern is being transferred to the substrate.

14. An extended length printed harness according to claim 1, wherein said conductive paths are formed additively.

15. An extended length printed harness according to claim 14, wherein said conductive paths are formed by electrophotographically transferring plateable toner onto said substrate.

16. An extended length printed harness according to claim 14, wherein said conductive paths are formed by magnetographically transferring plateable toner onto said substrate.

17. An extended length printed harness according to claim 1, further including:
   an adhesive toner applied to a surface of said substrate, and a metal pattern transferred from a sacrificial sheet onto said substrate.

18. An extended length printed harness according to claim 1, further including:
   metal particles tacked onto locally softened substrate by thermal means.

19. An extended length printed harness according to claim 1, further including:
   metal particles tacked onto locally softened substrate by chemical means.

20. An extended length printed harness according to claim 1, further including:
   at least one folded harness branch that extends in a direction perpendicular to at least one conductive path.

21. An extended length printed harness according to claim 1, further including:
   plural conductive layers, each having predetermined conductive paths.

22. An extended length printed harness according to claim 21, further including holes established through said plural conductive layers for interconnecting at least some of said conductive layers.

23. An extended length printed harness according to claim 1, further comprising:
   perforations formed in the flexible substrate; and
   a plurality of vias formed in said substrate with conductive patterns imaged on opposite sides of said substrate, said patterns and vias be rendered conductive by subsequent plating to form conductive paths on opposite sides of the substrate and through the substrate.

24. An extended length printed harness according to claim 20, wherein said harness is continuous and formed in at least two perpendicular directions with dimensions that exceed a preset range of motion of an imaging means used to form said toner image.

25. An extended length printed harness according to claim 20, wherein a dimension of said pattern is independent of restrictions in a range of motion of an imaging means used to form said toner image.

26. An extended length printed harness formed on a flexible substrate said harness comprising:
   a seamless, continuously updated conductor pattern formed as a toner image on the flexible substrate;
   conductive paths established on the substrate in accordance with the conductor pattern;
   harness branches of the printed harness formed by cutting the flexible substrate after said conductive paths have been established; and at least one folded harness branch formed such that said at least one harness branch extends in a direction oriented at an angle with respect to at least one conductive path.

27. An extended length printed harness according to claim 26, wherein said harness is continuous and formed in at least two perpendicular directions with dimensions that exceed a preset range of motion of an imaging means used to form said toner image.

28. An extended length printed harness according to claim 26, wherein a dimension of said pattern is independent of restrictions in a range of motion of an imaging means used to form said toner image.

* * * * *